United States Patent [19]

Cook et al.

[11] Patent Number: 4,636,920
[45] Date of Patent: Jan. 13, 1987

[54] PRINTED CIRCUIT BOARD MOUNTING APPARATUS

[75] Inventors: James G. Cook, Hanna City; Gary H. Knapp, Peoria, both of Ill.

[73] Assignee: Caterpillar Inc., Peoria, Ill.

[21] Appl. No.: 773,290

[22] Filed: Sep. 5, 1985

[51] Int. Cl.$^4$ .............................................. H05K 7/02
[52] U.S. Cl. ................................ 361/420; 174/52 PE; 361/399; 361/419
[58] Field of Search ................. 361/380, 394–395, 361/398–401, 404, 415, 417, 419–420; 174/52 PE

[56] References Cited

U.S. PATENT DOCUMENTS

| | | | |
|---|---|---|---|
| 2,993,715 | 7/1961 | Hutton | 403/224 |
| 3,699,394 | 10/1972 | Schuler | 361/395 X |
| 4,218,724 | 8/1980 | Kaufman | 339/17 M X |
| 4,226,491 | 10/1980 | Kazama et al. | 361/399 X |
| 4,249,229 | 2/1981 | Hester | 361/399 |
| 4,342,068 | 7/1982 | Kling | 361/399 |
| 4,542,260 | 9/1985 | Pearce | 174/52 PE |

FOREIGN PATENT DOCUMENTS

| | | | |
|---|---|---|---|
| 0724308 | 11/1966 | Italy | 16/2 |
| 1063863 | 4/1967 | United Kingdom | 16/2 |

Primary Examiner—Arthur T. Grimley
Assistant Examiner—Jane K. Lau
Attorney, Agent, or Firm—Terry D. Morgan

[57] ABSTRACT

An apparatus for mounting a printed circuit board within a potted member and enhancing the environmental isolation of the circuit board includes a first rigid tubular member and a second elastomeric tubular member. The elastomeric member is positioned about the rigid member and bonded thereto. The tubular members are inserted through openings in the circuit board to support the circuit board at a preselected height and provide bolt hole openings through the first rigid member for mounting the assembly at a desired location. A potting compound is applied in enveloping relation to the circuit board and elastomeric member while maintaining a clear passage through the bolt hole openings. The potting compound chemically bonds to the elastomeric member virtually eliminating water intrusion at the interface between the elastomeric member and the potting compound.

5 Claims, 4 Drawing Figures

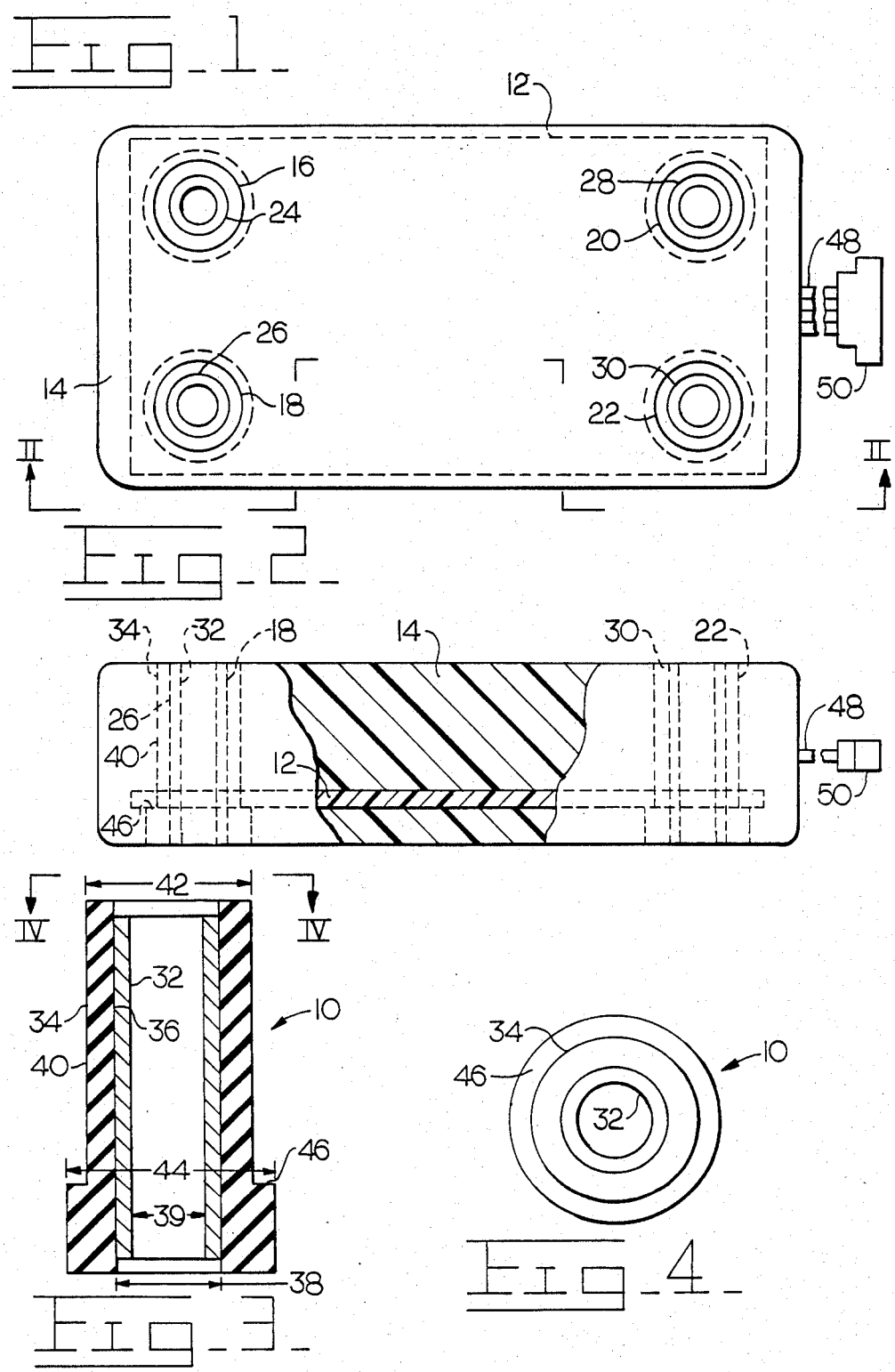

PRINTED CIRCUIT BOARD MOUNTING APPARATUS

DESCRIPTION

1. Technical Field

This invention relates generally to an apparatus for mounting a printed circuit board within a potting compound, and more particularly, to an apparatus for sealing a printed circuit board against environmental contamination.

2. Background Art

In the field of electronic design, it is well recognized that the introduction of contaminants onto operating electronic circuit boards can have undesirable effects on the useful life of the electronics. For example, water is a common contaminant which obviously results in a short circuit of the components. However, water does not necessarily have to be introduced by immersion, and often results from precipitation or even condensation in humid atmospheric conditions. Rugged conditions normally associated with the transportation industry are exacerbated in the heavy equipment industry where vehicles are commonly exposed directly to the environment on a year round basis. As electronic controls on vehicles have become commonplace, the industry has recognized that an excessive number of failures can be directly traced to poor sealing of the electronics package and a resultant intrusion of water. For example, the packaging technique illustrated in U.S. Pat. No. 4,249,229 issued to Thomas Hester is currently employed by many manufacturers, but suffers from a basic flaw which allows water to travel a torturous path along the interface of the potting compound and the mounting components and reach the circuit board. The coefficients of expansion of the housing and the potting compound differ significantly such that during a thermal cycle the housing expands, separates from the potting compound, and allows water to enter the sealed package. The same process occurs at the standoffs, completing the path between the external environment and the printed circuit board.

The present invention is directed to overcoming one or more of the problems as set forth above.

DISCLOSURE OF THE INVENTION

In accordance with one aspect of the present invention, an apparatus is used to mount a printed circuit board within a potting compound and enhance the electrical isolation of the printed circuit board from environmental conditions. The apparatus comprises a first tubular member which has an outer diameter of a preselected magnitude and is of a generally rigid construction. A second tubular member has an inner diameter of a preselected magnitude approximately equal to the first tubular member outer diameter and is disposed about the outer periphery of the first tubular member. The second tubular member is formed of a rubber composition and bonded to the first tubular member.

BRIEF DESCRIPTION OF THE DRAWINGS

FIG. 1 illustrates a plan view of a printed circuit board;

FIG. 2 illustrates a side view of a printed circuit board;

FIG. 3 illustrates a cross sectional view of the instant apparatus; and

FIG. 4 illustrates a top view of the instant apparatus.

BEST MODE FOR CARRYING OUT THE INVENTION

Referring now to the drawings, wherein a preferred embodiment of the present apparatus 10 is shown, FIGS. 1 and 2 illustrate the packaging of a printed circuit board 12. An apparatus 10 is used to mount the printed circuit board 12 within a potting compound member 14 and enhance the electrical isolation of the printed circuit board from environmental conditions. The printed circuit board 12 has a plurality of openings 16,18,20,22 extending therethrough and positioned about the circuit board 12. A plurality of standoffs 24,26,28,30 are associated with the plurality of openings 16,18,20,22 and act to position the circuit board 12 at a preselected height and provide rigid structure with bolt hole openings to fixedly mount the entire assembly.

As is best illustrated in FIGS. 3 and 4, each of the standoffs 24,26,28,30 has a first and second tubular member 32,34. The first tubular member 32 has a first outer periphery 36 and an outer diameter 38 of a preselected magnitude. The first tubular member 32 is of a generally rigid construction and preferably formed of a metallic material; however, it is envisioned that a variety of materials could be easily substituted including plastic, fabric phenolic, paper phenolic, or a close wound wire tube.

The first tubular member 32 has an interior diameter 39 adapted to allow a fastener such as a bolt to pass through the first tubular member and into an associated structure to secure the circuit board 12 at a desired location. The rigidity of the first tubular member 32 ensures that the fastener does not deform the second tubular member 34 under torque. While the first tubular member 32 has been illustrated as preferably having openings at each end portion, it has been envisioned that the apparatus 10 need not pass entirely through the potted member 14, but have a single blind hole opening onto a surface of the potted member 14. The interior of the first tubular member 32 could be threaded to accept a similarly threaded bolt and mount the assembly by passing the bolt through an associated structure threaded into the first tubular member 32. A variety of methods for mounting the apparatus 10 are envisioned, for example, self threading screws or pop rivets could be easily substituted for the mounting means disclosed herein without departing from the spirit of the intended invention.

The second tubular member 34 has an inner diameter substantially the same size as the first tubular member outer diameter 38 and a second outer periphery 40 which includes first and second outer diameters 42,44. The first and second outer diameters 42,44) are respectively less than and greater than the circuit board openings 16,18,20,22 diameter. The second tubular member 34 is disposed about the first outer periphery 36 of the first tubular member 34, formed of an elastomeric material, preferably rubber, and is bonded to the first tubular member 32.

In the preferred embodiment, the second tubular member 34 is bonded to the first tubular member 32 via a vulcanizing process to prevent the intrusion of water intermediate the first and second tubular members 32,34. However, the second tubular member 34 need not be vulcanize bonded to the first tubular member 32, but could be easily bonded with a post vulcanizing adhesive system such as a cyanoacrylate. Prior to the bonding process, the surface of the first tubular member 32 is cleaned preferably by sandblasting; however, sanding, solvent wipe, acid etch, wire wheel brush, or a primer system can also be employed to give desirable cleaning results.

The surface of the first tubular member 32 is thoroughly cleaned to enhance the adhesion between the rubber and the first tubular member 32. Secure bonding between the first and second tubular members 32,34 is not necessary to prevent water intrusion onto the circuit board 12, but serves to anchor the entire assembly through the mechanical connection between the base, first tubular member 32, and fastener.

As is best illustrated in FIG. 2, the standoffs 24,26,28,30 extend through the openings 16,18,20,22 and support the circuit board 12 on the second outer periphery 40 intermediate the first and second outer diameters 42,44. The intersection of the first and second outer diameters 42,44 form a shoulder 46 upon which the circuit board 12 rests at a preselected height. The circuit board 12 is supported at the preselected height to assure that the potting compound completely envelops the circuit board 12 so that the only possible paths between the external environment and the circuit board 12 are via the interface between the potted member 14 and the second tubular member 34 or directly through the potted member 14.

In the preferred embodiment, a potting compound commercially available from Emerson and Cumming as part number 2850FT catalyst 23LV is used and has the desirable property of being substantially impervious to water intrusion, and yet does not chemically react with the circuit board 12. By proper selection of the potting compound one of the two possible paths for water intrusion is eliminated. The remaining path is also substantially eliminated in that the potted member 14 adheres to in sealing relation with the second tubular member 34.

Prior to introduction of the potting compound, the second tubular member 34 is solvent wiped to produce a chemically clean and active surface whereby a complete bonding occurs between the rubber of the second tubular member 34 and the potted member 14. Thermal expansion or contraction has little effect on the bonded interface because the coefficient of expansion of the potting compound is small. The rubber of the tubular member 34 is elastic under both hot and cold conditions which allows the both potting compound and rubber member 34 to move together as a single unit under thermal stress.

FIG. 3 illustrates the apparatus 10 where the first and second tubular members 32,34 have first and second preselected lengths. The length of the second tubular member 34 is shown to be greater than the length of the first tubular member 32 such that the second tubular member 34 extends beyond each end portion of the first tubular member 32. During mounting of the assembly, the extended portions of the second tubular member 34 are deformed by the fastener to seal the interior of the first tubular member 32 against water intrusion. The extended portions are not normally necessary and should be considered an alternate embodiment of the apparatus 10 for use when it is desirable to prevent water intrusion into the interior of the first tubular member 32.

A wiring harness 48 and electrical connector 50 are shown in FIGS. 1 and 2 and are necessary for the circuit board 12 to provide electrical signals to an external device which the circuit board 12 is intended to control. Possible water entry is similarly avoided at the interface between the potted member 14 and the insulation of the wiring harness 48 by cleaning and chemically activating the exterior surface of the wiring harness insulation by a solvent wipe. The wire insulation will then chemically bond to the potted member 14 and prevent water entry.

INDUSTRIAL APPLICABILITY

Assembly of the standoffs 24,26,28,30 and the method of potting the circuit board 12 involves first manufacturing the standoffs 24,26,28,30 via selection of the first tubular member 32 of a desired length and thorough cleansing by a sandblasting process. The cleansing is performed in anticipation of the bonding of the second tubular member 34 to the first tubular member 32 through a vulcanizing process.

The outer surface of the second tubular member 34 is then solvent wiped to provide a clean and chemically active surface and subsequent good adhesion between the potted member 14 and second tubular member 34. The standoffs 24,26,28,30 are inserted in the circuit board openings 16,18,20,22 and support the circuit board 12 within a mold (not shown) which has an opening for accepting the potting compound. The potting compound is prepared according to manufacturers' specifications and delivered into the mold such that the circuit board 12 is completely enveloped by the potting compound. After a proper curing time, the mold is removed, leaving a brick of potting which is impervious to water intrusion and can, therefore, be used as a completed package (i.e., a housing is not required).

Other aspects, objects, and advantages of this invention can be obtained from a study of the drawings, the disclosure, and the appended claims.

We claim:

1. An environmentally protected printed circuit board, said printed circuit board having a plurality of openings of a preselected diameter extending therethrough, comprising:

a plurality of standoffs each having a first and second tubular member, said first tubular member having a first outer periphery including an outer diameter of a preselected magnitude and being of a generally rigid construction, said second tubular member having an inner diameter at least as small as the first tubular member outer diameter, and a second outer periphery including first and second outer diameters respectively less than and greater than the diameter of said circuit board openings, said second tubular member being disposed about the outer periphery of said first tubular member, formed of rubber, and bonded to said first tubular member, said plurality of standoffs extending through said plurality of printed circuit board openings and supporting said circuit board on said second outer periphery intermediate said first and second outer diameters; and a potted member disposed in enveloping relation to said printed circuit board and adhering in sealing relation with said second tubular member.

2. The circuit board, as set forth in claim 1, wherein said first tubular member is bonded to said second tubular member by a vulcanizing process.

3. The circuit board, as set forth in claim 1, wherein said first tubular member comprises a metallic material.

4. The circuit board, as set forth in claim 1, wherein said first and second tubular members have first and second preselected lengths, the length of said second tubular member being greater than the length of said first tubular member and positioned about the first tubular member to extend beyond each end portion of said first tubular member.

5. The circuit board, as set forth in claim 1, wherein said first tubular member has a preselected longitudinal length and said potted member has a thickness no greater than the length of said first tubular member.

* * * * *